United States Patent
Yabuta et al.

(10) Patent No.: US 8,502,222 B2
(45) Date of Patent: Aug. 6, 2013

(54) AMORPHOUS OXIDE SEMICONDUCTOR, SEMICONDUCTOR DEVICE, THIN FILM TRANSISTOR AND DISPLAY DEVICE

(75) Inventors: Hisato Yabuta, Machida (JP); Ayanori Endo, Chigasaki (JP); Nobuyuki Kaji, Kawasaki (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/403,536

(22) Filed: Feb. 23, 2012

(65) Prior Publication Data

US 2012/0146021 A1   Jun. 14, 2012

Related U.S. Application Data

(63) Continuation of application No. 12/594,629, filed as application No. PCT/JP2008/057648 on Apr. 15, 2008, now Pat. No. 8,154,017.

(30) Foreign Application Priority Data

Apr. 25, 2007   (JP) .................................. 2007-115617

(51) Int. Cl.
*H01L 29/12* (2006.01)

(52) U.S. Cl.
USPC .......... 257/43; 257/59; 257/72; 257/E29.095; 438/151; 438/282; 438/483

(58) Field of Classification Search
USPC ........ 257/43, E29.095, 59, 72, 290; 438/151, 438/282, 483
See application file for complete search history.

(56) References Cited

U.S. PATENT DOCUMENTS

| 5,622,653 | A | 4/1997 | Orita et al. ................ 252/518 |
| 7,411,209 | B2 | 8/2008 | Endo et al. ................ 257/43 |
| 7,468,304 | B2 | 12/2008 | Kaji et al. ................ 428/308 |
| 7,893,431 | B2 | 2/2011 | Kim et al. ................ 257/43 |
| 2006/0108529 | A1 | 5/2006 | Saito et al. ................ 250/338.4 |
| 2006/0108636 | A1* | 5/2006 | Sano et al. ................ 257/347 |
| 2006/0110867 | A1* | 5/2006 | Yabuta et al. ................ 438/151 |
| 2006/0113565 | A1* | 6/2006 | Abe et al. ................ 257/197 |
| 2007/0194379 | A1 | 8/2007 | Hosono et al. ................ 257/347 |
| 2008/0197350 | A1* | 8/2008 | Park et al. ................ 257/43 |
| 2009/0045399 | A1* | 2/2009 | Kaji et al. ................ 257/43 |

(Continued)

FOREIGN PATENT DOCUMENTS

| EP | 1 737 044 A1 | 12/2006 |
| JP | 2006-165529 | 6/2006 |

(Continued)

OTHER PUBLICATIONS

Office Action issued Aug. 7, 2012, in counterpart Japanese application 2007-115617, with translation.

(Continued)

*Primary Examiner* — N Drew Richards
*Assistant Examiner* — Ankush Singal
(74) *Attorney, Agent, or Firm* — Fitzpatrick, Cella, Harper & Scinto

(57) ABSTRACT

An amorphous oxide semiconductor contains at least one element selected from In, Ga, and Zn at an atomic ratio of InxGayZnz, wherein the density M of the amorphous oxide semiconductor is represented by the relational expression (1) below:

$$M \geq 0.94 \times (7.121x+5.941y+5.675z)/(x+y+z) \qquad (1)$$

where $0 \leq x \leq 1$, $0 \leq y \leq 1$, $0 \leq z \leq 1$, and $x+y+z \neq 0$.

6 Claims, 3 Drawing Sheets

U.S. PATENT DOCUMENTS

| | | | |
|---|---|---|---|
| 2009/0072232 A1 | 3/2009 | Hayashi et al. | 257/43 |
| 2009/0278122 A1 | 11/2009 | Hosono et al. | 257/43 |
| 2009/0280600 A1 | 11/2009 | Hosono et al. | 438/104 |
| 2011/0101352 A1 | 5/2011 | Hosono et al. | 257/57 |
| 2011/0201162 A1 | 8/2011 | Hosono et al. | 438/163 |
| 2012/0012838 A1 | 1/2012 | Hosono et al. | 257/43 |

FOREIGN PATENT DOCUMENTS

| | | |
|---|---|---|
| JP | 2006-347861 | 12/2006 |
| JP | 2007-073312 | 3/2007 |
| TW | 200534488 | 10/2005 |
| WO | 2006/051993 | 5/2006 |
| WO | 2007/058232 | 5/2007 |

OTHER PUBLICATIONS

D.C. Craigen et al., "Improved Electrical Properties of Non-Hydrogenated a-Si Densified by IBAD" *J. Phys.: Condens. Matter*, 4 (1992), pp. 9843-9854, XP020056888.

F.M. Hossain et al., "Modeling and Simulation of Polycrystalline ZnO Thin-Film Transistors," *J. Appl. Phys.*, vol. 94, No. 12, Dec. 15, 2003, pp. 7768-7777.

H. Leplan et al., "Residual Stresses in Evaporated Silicon Dioxide Thin Films: Correlation with Deposition Parameters and Aging Behavior," *J. Appl. Phys.*, vol. 78, No. 2, Jul. 15, 1995, pp. 962-968.

K. Nomura et al., "Local Coordination Structure and Electronic Structure of the Large Electron Mobility Amorphous Oxide Semiconductor In-Ga-Zn-O: Experimentation and ab initio Calculations", *Phys. Rev. B* 75, 035212 (2007), URL:http://link.aps.org/doi/10.1103/PhysRevB.75.035212.

K. Nomura et al., "Room-Temperature Fabrication of Transparent Flexible Thin-Film Transistors Using Amorphous Oxide Semiconductors," *Nature*, vol. 432, Nov. 25, 2004, pp. 488-492.

H. Yabuta et al., "High-Mobility Thin-Film Transistor with Amorphous $InGaZnO_4$ Channel Fabricated by Room Temperature RF-Magnetron Sputtering," *Applied Physics Letters*, vol. 89, 2006, pp. 112123-1 to 112123-3.

Communication from the Korean Patent Office dated Mar. 21, 2011, issued in counterpart Korean Application No. 10-2009-7023596.

Office Action dated Sep. 21, 2011, issued in counterpart European application EPA 08740693.0.

Office Action dated Jan. 16, 2012, issued in counterpart Taiwan (R.O.C.) Patent Application No. 097114860, and English-language translation.

Office Action (Summons to Attend Oral Proceedings) issued May 3, 2013, in counterpart European application 08740693.0.

\* cited by examiner

US 8,502,222 B2

AMORPHOUS OXIDE SEMICONDUCTOR, SEMICONDUCTOR DEVICE, THIN FILM TRANSISTOR AND DISPLAY DEVICE

RELATED APPLICATIONS

The present application is a continuation of application Ser. No. 12/594,629, filed Oct. 5, 2009, which is a National Stage filing under 35 U.S.C. §371 of International Application No. PCT/JP2008/057648, filed Apr. 15, 2008. The present application claims benefit of parent application Ser. No. 12/594,629 (that is, PCT/JP2008/057648) under 35 U.S.C. §120, and claims priority benefit under 35 U.S.C. §119 of Japanese Patent Application 2007-115617, filed Apr. 25, 2007. The entire contents of each of the mentioned prior applications are incorporated herein by reference.

TECHNICAL FIELD

The present invention relates to an amorphous oxide semiconductor, a semiconductor device, and a thin film transistor. In particular, the present invention relates to an amorphous oxide semiconductor containing at least one element selected from In, Ga, and Zn; and a semiconductor device and a thin-film transistor employing the amorphous oxide semiconductor.

BACKGROUND ART

Thin-film oxide semiconductors are being studied for use as a channel layer of a transistor. In particular, ZnO oxide-semiconductors are being studied actively for use as a channel of a thin-film transistor (TFT).

However, the thin ZnO film as a semiconductor film, when formed at room temperature, will become polycrystalline and will have several nanometers to several tens of nanometers of roughness at a semiconductor-insulator interface, a semiconductor-semiconductor interface, or a semiconductor-metal interface: the interface is highly important in the semiconductor device.

Further, in the polycrystalline matter, crystal grain boundaries will inevitably be formed. The grain boundary will cause defects in conduction or will cause deterioration of the property owing to adsorption of gas molecules from the atmosphere to cause instability of the characteristics, disadvantageously (*Journal of Applied Physics*, Vol. 94, p. 7768).

To overcome the aforementioned disadvantages resulting from the rough interface or the grain boundaries, U.S. Patent Application Publication No. 2007/0194379 discloses a high-performance TFT which employs an amorphous oxide semiconductor as a thin-film of an oxide semiconductor.

The semiconductor formed in an amorphous state gives an excellent interface having roughness of less than a nanometer without the roughness of the interface of ZnO, enabling a higher performance of the semiconductor device. Thereby, a semiconductor film can be formed without grain boundaries, which prevents deterioration and instability of the properties caused by the grain boundaries.

Therefore, an amorphous oxide semiconductor film and a TFT containing this semiconductor film were produced by pulse laser vapor deposition (PLD) under the same conditions as in the above U.S. Patent Application Publication No. 2007/0194379. The obtained semiconductor film and the TFT had properties equivalent to the properties shown in that U.S. patent document, or reported in *Nature*, Vol. 432, p. 488.

Further, an amorphous oxide semiconductor film and TFT were produced by sputtering by use of a target of the composition $InGaO_3(ZnO)$, namely an oxide of $In_1Ga_1Zn_1$. Thereby, an amorphous oxide semiconductor film and a TFT film were obtained which had as excellent properties as the one produced by the PLD process (Applied Physics Letters, Vol. 89, pages 112123-1 to 112123-3).

After further investigation, the inventors of the present invention have found the conditions for producing the amorphous oxide semiconductor having further improved properties of the semiconductor and TFT.

The present invention provides an amorphous oxide semiconductor containing at least one element selected from In, Ga, and Zn; and a semiconductor device and a thin-film transistor employing the amorphous oxide semiconductor.

DISCLOSURE OF THE INVENTION

The present invention is directed to an amorphous oxide semiconductor containing at least one element selected from In, Ga, and Zn at an atomic ratio of $In_xGa_yZn_z$, wherein the density M of the amorphous oxide semiconductor is represented by the relational expression (1) below:

$$M \geq 0.94x(7.121x+5.941y+5.675z)/(x+y+z) \quad (1)$$

where $0 \leq x \leq 1$, $0 \leq y \leq 1$, $0 \leq z \leq 1$, and $x+y+z \neq 0$.

In the amorphous oxide semiconductor, the relations $x>0$, $y>0$, and $z>0$ can be accepted.

In the amorphous oxide semiconductor, the ratios $x/(x+y+z)$, $y/(x+y+z)$, and $z/(x+y+z)$ can be respectively not less than 0.2.

The present invention is directed to a semiconductor device which employs the amorphous oxide semiconductor.

The present invention is directed to a thin film transistor which employs the amorphous oxide semiconductor as a channel layer.

The present invention enables production of an element having high performance, high stability and high reliability for TFT employing an oxide semiconductor thin film as the channel layer.

Further features of the present invention will become apparent from the following description of exemplary embodiments with reference to the attached drawings.

BEST MODES FOR CARRYING OUT THE INVENTION

Figure 1:
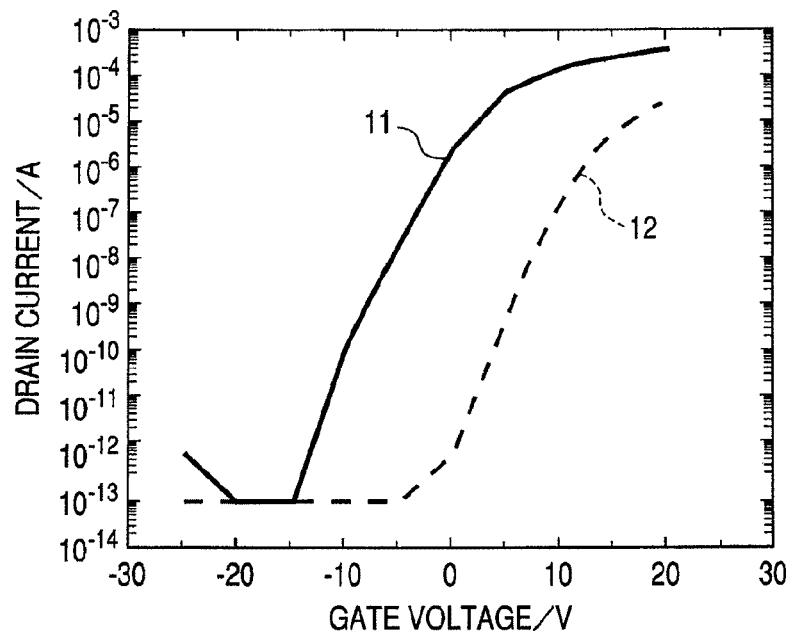
FIG. 1 is a graph showing the conduction properties of a bottom-gate type TFT employing an amorphous oxide semiconductor of the present invention and of a conventional one.

The best mode of practicing the present invention is described with reference to the attached drawings.

Firstly the amorphous oxide semiconductor is described.

The amorphous oxide semiconductor of the present invention contains at least one element selected from In, Ga, and Zn at an atomic ratio represented by $In_xGa_yZn_z$.

In the composition, preferably $x>0$, $y>0$ and $z>0$, and more preferably $x/(x+y+z) \geq 0.2$, $y/(x+y+z) \geq 0.2$, and $z/(x+y+z)$ ≧0.2. That is, the ratios $x/(x+y+z)$, $y/(x+y+z)$, and $z/(x+y+z)$ are preferably not less than 0.2 respectively.

The amorphous oxide semiconductor may contain another oxide as an additive, the additive including oxides of Mg, Ca, B, Al, Fe, Ru, Si, Ge, and Sn.

The amorphous oxide semiconductor of the present invention is characterized by the density thereof, which is not less than 94.0% of the theoretical density defined below.

$In_2O_3$ has a density of 7.121 g/cm$^3$ according to PDF No. 00-006-0416, International Center for Diffraction Data.

$Ga_2O_3$ has a density of 5.941 g/cm$^3$ according to PDF No. 00-041-1103, International Center for Diffraction Data.

ZnO has a density of 5.675 g/cm$^3$ according to PDF No. 00-036-1451, International Center for Diffraction Data.

Accordingly, the theoretical density of the amorphous oxide semiconductor containing In, Ga, and Zn at a composition ratio of $In_xGa_yZn_z$ is calculated to be $(7.121x+5.941y+5.675z)/(x+y+z)$ [g/cm$^3$].

When the amorphous oxide semiconductor contains additionally an oxide of an element other than In, Ga, and Zn, the theoretical density is defined as below. The added element is represented by M, and the composition ratio of In, Ga, Zn, and M is represented by $In_xGa_yZn_zM_w$, and the density of the oxide having the lowest standard free energy of formation among the oxides of the element M is represented by D. Then the theoretical density is represented by $(7.121x+5.941y+5.675z+Dw)/(x+y+z+w)$ [g/cm$^3$].

The amorphous oxide semiconductor of the present invention has a density of not less than 94% of the above theoretical density. This relation is expressed by relational expression (1) below:

$$M \geq 0.94x(7.121x+5.941y+5.675z)/(x+y+z) \quad (1)$$

where $0 \leq x \leq 1$, $0 \leq y \leq 1$, $0 \leq z \leq 1$, and $x+y+z \neq 0$.

Generally, a thin film of an amorphous substance has a density lower than the theoretical density owing to formation of void in the thin film or another cause. For example, the amorphous silica film formed by vacuum vapor deposition as described in the *Journal of Applied Physics*, Vol. 78, pp. 962-968 has a density of 90% (2.0 g/cm$^3$) of or lower than the density (2.2 g/cm$^3$) of bulk silica. Reportedly, the film contains voids capable of adsorbing moisture.

Such voids in the amorphous oxide semiconductor film can scatter the carrier electrons or lengthen the conduction path to affect adversely the conduction properties of the semiconductor such as the mobility.

To overcome such adverse effects, in the examples described below, the inventors of the present invention prepared an amorphous oxide semiconductor film by a sputtering process, which enables readily formation of a relatively high density of a thin film, by adjusting the film-forming temperature.

Thereby, a thin film of the amorphous oxide semiconductor was prepared which has a higher film density containing In, Ga, and Zn at a composition ratio of $In_xGa_yZn_z$. The thin film was found to be superior to conventional ones in the conductivity characteristics, especially in the mobility.

The above-mentioned amorphous oxide semiconductor film having a density of not less than 94.0% of the theoretical density is prepared preferably by a vacuum vapor deposition including sputtering such as rf-sputtering and DC-sputtering, and pulse laser vapor deposition (PLD), especially by sputtering.

The temperature for formation of the above semiconductor is preferably not lower than room temperature, more preferably in the range from 150° C. to crystallization-causing temperature.

In another preferred method of formation of the high-density amorphous oxide semiconductor film, firstly an amorphous oxide semiconductor film having a density lower than 94.0% of the theoretic density is formed, and then the film is post-treated to increase the density to 94.0% or higher of the theoretical density. The preferred post-treatment includes heat treatment, ion irradiation, plasma irradiation, and radical irradiation.

The above amorphous oxide semiconductor is useful for a thin film transistor (TFT). The above amorphous oxide semiconductor is useful as the channel layer of the TFT.

In the TFT, a Si oxide film or a metal oxide film is preferably employed as the gate-insulating film. The oxide for the gate-insulating film may contain a small amount of nitrogen. A Si nitride is also preferred as the gate-insulating film. The insulating film is formed preferably by vacuum vapor deposition including PLD (pulse vapor deposition) or sputtering.

The amorphous oxide semiconductor derived as described above has properties (e.g., mobility) more suitable for a semiconductor device than conventional amorphous oxide semiconductors. With the amorphous oxide semiconductor, a semiconductor device, especially a TFT, can be produced having a higher performance than conventional semiconductor device.

EXAMPLES

Example 1

Amorphous Oxide Semiconductor

Firstly, an n-type Si substrate having thereon a thermally oxidized $SiO_2$ film of 100 nm thick was prepared. On the $SiO_2$ film, an amorphous oxide semiconductor film containing In, Ga, and Zn at a composition ratio of $In_xGa_yZn_z$ was formed in a thickness of 40 nm at the substrate temperature of 200° C. by rf-sputtering with an $InGaO_3(ZnO)$ target.

The composition of the formed film, namely $x/(x+y+z)$, $y/(x+y+z)$, and $z/(x+y+z)$, was determined to be respectively 0.406, 0.376, and 0.218 by X-ray fluorescence analysis. From the composition analysis result, the theoretical density was estimated at 6.36 g/cm$^3$.

The obtained film was measured for X-ray reflectivity with an X-ray diffraction apparatus equipped with a Cu—Kα X-ray source and an X-ray minor.

Figure 2:
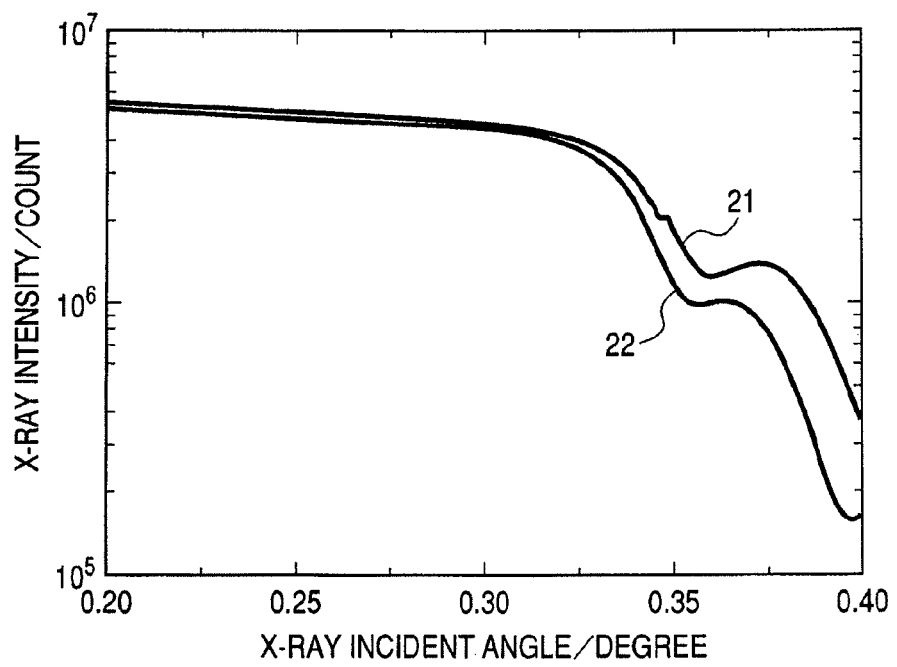
FIG. 2 is a graph showing X-ray reflectivity of an amorphous oxide semiconductor of the present invention and of a conventional one.

FIG. 2 shows the measurement result by curve 21. Therefrom the film density was estimated at 6.12 g/cm$^3$, 96.2% of the above-estimated theoretical density.

Separately, another amorphous oxide semiconductor film of the composition ratio of $In_xGa_yZn_z$ was formed by the same method in a thickness of 40 nm on the same substrate kept at room temperature (substrate temperature monitor reading: 22° C.).

The composition of the formed film, $x/(x+y+z)$, $y/(x+y+z)$, and $z/(x+y+z)$, was determined to be respectively 0.397, 0.364, and 0.239 by X-ray fluorescence analysis. From the composition analysis result, the theoretical density was estimated at 6.35 g/cm$^3$.

The obtained film was measured for X-ray reflectivity. FIG. 2 shows the measurement result by curve 22. Therefrom the film density was estimated at 5.95 g/cm$^3$, 93.8% of the above-estimated theoretical density.

As described later, TFTs were produced by use of the above amorphous oxide semiconductor film as the channel layer. The amorphous oxide semiconductor films were tested for the field-effect mobility. The film having a density of 96.2% of the theoretical density gave the mobility of 12 cm$^2$/Vs, whereas the film having a density of 93.8% of the theoretical density gave the mobility of 5 cm²/Vs.

A film produced according to the method disclosed in the above non-patent literature 3 had a density of 93.7% of the theoretical density, and a film produced according to the method disclosed in the above non-patent literature 2 had a density of 83.7% of the theoretical density. By comparison of the two films, the field-effect mobility is higher in the film having the density of 93.7% of the theoretical density.

From the above results, the density of the amorphous oxide semiconductor is correlative with the properties, especially the mobility: the higher the density, the higher is the mobility.

In the present invention, it was found that the film having the density of not lower than 94.0% of the theoretical density is superior in its properties to a conventional film of a lower density.

In the above Example, the amorphous oxide semiconductor film of a higher density was obtained by controlling the film formation conditions.

In another method, a film of a density of lower than 94.0% of the theoretical density is formed firstly, and then the density is increased by irradiation of ions, plasma, radicals, or the like. Thereby, an amorphous oxide semiconductor can be obtained which has a high performance similar to that obtained by controlling the film formation conditions.

Example 2

Production of TFT Element

Figure 3:
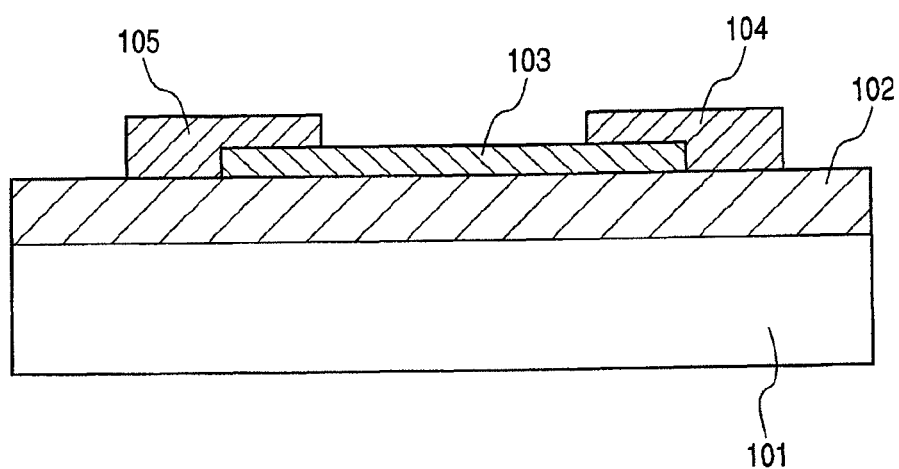
FIG. 3 illustrates a structure of the bottom-gate type TFT employed in Examples of the present invention.

A bottom-gate type of TFT element illustrated in FIG. 3 was produced as a semiconductor device employing an amorphous oxide semiconductor film.

Firstly, an n-type Si substrate 101 having thereon a thermally oxidized $SiO_2$ film 102 of 100 nm thick was prepared. On the $SiO_2$ film, amorphous oxide semiconductor film 103 containing In, Ga, and Zn at a composition ratio of $In_xGa_yZn_z$ was formed in a thickness of 40 nm at the substrate temperature of 200° C. by rf-sputtering with an $InGaO_3(ZnO)$ target. The obtained film had a density of 96.2% of the theoretical density.

The obtained amorphous oxide semiconductor film containing In, Ga, and Zn at a composition ratio of $In_xGa_yZn_z$ was etched in a necessary size, and then source electrode 104 and drain electrode 105 were formed by photolithography and a lift-off method. The material of the electrodes was a multilayer of Au (150 nm)/Ti (5 nm), and film formation was conducted by electron-beam vapor deposition.

The n-Type Si 101, the substrate, was utilized as the gate electrode, and $SiO_2$ film 102 was utilized as the gate-insulating film of the TFT element.

Among the obtained TFT elements, a TFT element having a channel length of 10 μm and a channel width of 30 μm was tested for conduction properties (drain current/gate voltage characteristic, etc.). FIG. 1 shows the characteristic as curve 11. The field-effect mobility was 12 cm²/Vs.

Separately, in the same manner and constitution as above, an amorphous oxide semiconductor film of the composition ratio of $In_xGa_yZn_z$ was formed on a substrate at room temperature (substrate temperature monitor reading: 22° C.) in a thickness of 40 nm (93.8% of the theoretical density), and a TFT element was produced.

The TFT element having a channel length of 10 μm and a channel width of 30 μm was tested for conduction properties. FIG. 1 shows the characteristic as curve 12. The field-effect mobility was 5 cm²/Vs.

As described above, a TFT element of higher performance was obtained by use of an amorphous oxide semiconductor having a higher density as the channel layer.

This high-density amorphous oxide semiconductor is effective not only in the TFT but also in a device requiring a high mobility such as a transparent electrode material in an electronic device.

Figure 4:
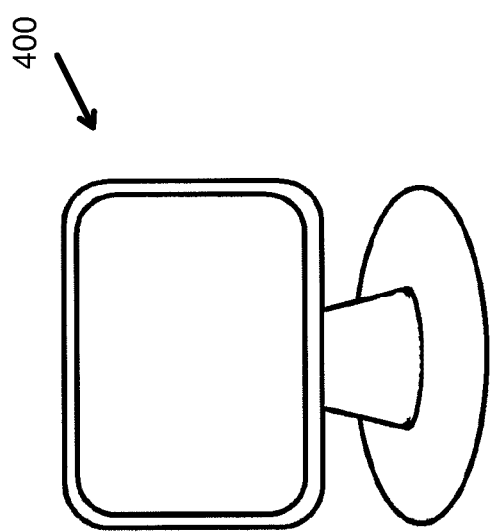
FIG. 4 is a schematic illustration of a display device that may incorporate a TFT according to the present invention.

The amorphous oxide semiconductor containing In, Ga, and Zn in a composition ratio of $In_xGa_yZn_z$ of the present invention is useful widely as a material for parts of an electronic device like a display (a schematic example 400 of which is illustrated in FIG. 4). In particular, the TFT employing this amorphous oxide semiconductor is useful widely as a switching element for an LCD, and an organic EL display, or the like, and a switching element of a switching element of a matrix device such as a light-receiving element, and sensor element. Further the amorphous oxide semiconductor is useful for an IC card, an IC tag, or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A display device comprising a thin film transistor comprising:
    a channel layer;
    a source electrode electrically connected to said channel layer;
    a drain electrode electrically connected to said channel layer; and
    a gate electrode adjacent to said channel layer with a gate insulating film interposed therebetween,
    said channel layer comprising an oxide semiconductor comprising at least one element selected from In, Ga, and Zn at an atomic ratio of $In_xGa_yZn_z$, wherein a mass density M of said oxide semiconductor is represented by relational expression (1) shown below:

$$M \geq 0.94 \times (7.121x + 5.941y + 5.675z)/(x+y+z) \qquad (1)$$

where $0 \leq x \leq 1$, $0 \leq y \leq 1$, $0 \leq z \leq 1$, and $x+y+z \neq 0$.

2. The display device according to claim 1, wherein $x>0$, $y>0$, and $z>0$.

3. The display device according to claim 1, wherein ratios $x/(x+y+z)$, $y/(x+y+z)$, and $z/(x+y+z)$ are each not less than 0.2.

4. The display device according to claim 1, wherein said oxide semiconductor is an amorphous oxide semiconductor.

5. The display device according to claim 1, wherein the display device is a liquid crystal display device.

6. The display device according to claim 1, wherein the display device is an organic EL display device.

* * * * *